United States Patent
Lai et al.

(10) Patent No.: US 9,502,335 B2
(45) Date of Patent: Nov. 22, 2016

(54) PACKAGE STRUCTURE AND METHOD FOR FABRICATING THE SAME

(71) Applicant: Siliconware Precision Industries Co., Ltd., Taichung (TW)

(72) Inventors: Chieh-Lung Lai, Taichung (TW); Hsien-Wen Chen, Taichung (TW); Hong-Da Chang, Taichung (TW); Mao-Hua Yeh, Taichung (TW)

(73) Assignee: Siliconware Precision Industries Co., Ltd., Taichang (TW)

( * ) Notice: Subject to any disclaimer, the term of this patent is extended or adjusted under 35 U.S.C. 154(b) by 0 days.

(21) Appl. No.: 14/487,548

(22) Filed: Sep. 16, 2014

(65) Prior Publication Data

US 2015/0325556 A1 Nov. 12, 2015

(30) Foreign Application Priority Data

May 8, 2014 (TW) .............................. 103116365 A (51) Int. Cl.
| | |
|---|---|
| *H01L 23/48* | (2006.01) |
| *H01L 23/52* | (2006.01) |
| *H01L 29/40* | (2006.01) |
| *H01L 23/49* | (2006.01) |
| *H01L 25/10* | (2006.01) |
| *H01L 25/00* | (2006.01) |
| *H01L 21/56* | (2006.01) |
| *H01L 23/31* | (2006.01) |

(52) U.S. Cl.
CPC .............. *H01L 23/49* (2013.01); *H01L 21/56* (2013.01); *H01L 23/3107* (2013.01); *H01L 25/105* (2013.01); *H01L 25/50* (2013.01); *H01L 2224/16225* (2013.01); *H01L 2224/48091* (2013.01); *H01L 2224/48227* (2013.01); *H01L 2225/1052* (2013.01); *H01L 2924/15311* (2013.01); *H01L 2924/181* (2013.01)

(58) Field of Classification Search
CPC ....... H01L 23/48; H01L 23/52; H01L 29/40; H01L 2924/01079; H01L 2924/15311; H01L 2924/48091
USPC ......................................................... 257/777
See application file for complete search history.

(56) References Cited

U.S. PATENT DOCUMENTS

| | | | |
|---|---|---|---|
| 8,174,119 B2* | 5/2012 | Pendse ........................ | 257/738 |
| 8,372,741 B1* | 2/2013 | Co ......................... | H01L 24/03 |
| | | | 219/56.22 |

(Continued)

*Primary Examiner* — Phuc Dang
(74) *Attorney, Agent, or Firm* — Mintz Levin Cohn Ferris Glovsky and Popeo, P.C.; Peter F. Corless; Steven M. Jensen (57) ABSTRACT

A package structure is provided, which includes: a chip carrier having a plurality of conductive connection portions; at least an electronic element disposed on the chip carrier; a plurality of conductive wires erectly positioned on the conductive connection portions, respectively; an encapsulant formed on the chip carrier for encapsulating the conductive wires and the electronic element, wherein one ends of the conductive wires are exposed from the encapsulant; and a circuit layer formed on the encapsulant and electrically connected to exposed ends of the conductive wires. According to the present invention, the conductive wires serve as an interconnection structure. Since the wire diameter of the conductive wires is small and the pitch between the conductive wires can be minimized, the present invention reduces the size of the chip carrier and meets the miniaturization requirement.

26 Claims, 7 Drawing Sheets

(56) References Cited

U.S. PATENT DOCUMENTS

| | | | |
|---|---|---|---|
| 2006/0047194 A1* | 3/2006 | Grigorov | 600/372 |
| 2009/0152708 A1* | 6/2009 | Lee et al. | 257/690 |
| 2010/0164083 A1* | 7/2010 | Yim | H01L 23/3135 257/686 |
| 2011/0020973 A1* | 1/2011 | Ovshinsky | 438/61 |
| 2013/0200509 A1* | 8/2013 | Kim | 257/692 |
| 2015/0014864 A1* | 1/2015 | Chen | H01L 23/3135 257/778 |
| 2015/0092358 A1* | 4/2015 | Wang | H05K 3/007 361/748 |

* cited by examiner

PACKAGE STRUCTURE AND METHOD FOR FABRICATING THE SAME

CROSS-REFERENCES TO RELATED APPLICATIONS

This application claims under 35 U.S.C. §119(a) the benefit of Taiwanese Application No. 103116365, filed May 8, 2014, the entire contents of which is incorporated herein by reference.

BACKGROUND OF THE INVENTION

1. Field of the Invention

The present invention relates to packaging processes, and more particularly, to a package structure and a method for fabricating the same.

2. Description of Related Art

Along with the progress of semiconductor packaging technologies, a variety of package types have been developed for semiconductor devices. To improve electrical performances and save spaces, a plurality of packages can be stacked to form a package on package (POP) structure or a package in package (PIP) structure. Such a packaging method allows integration of heterogeneous technologies in a system-in-package (SiP) so as to systematically integrate a plurality of electronic elements having different functions, such as a memory, a CPU (Central Processing Unit), a GPU (Graphics Processing Unit), an image application processor and so on, and therefore is applicable to various thin type electronic products.

Figure 3:
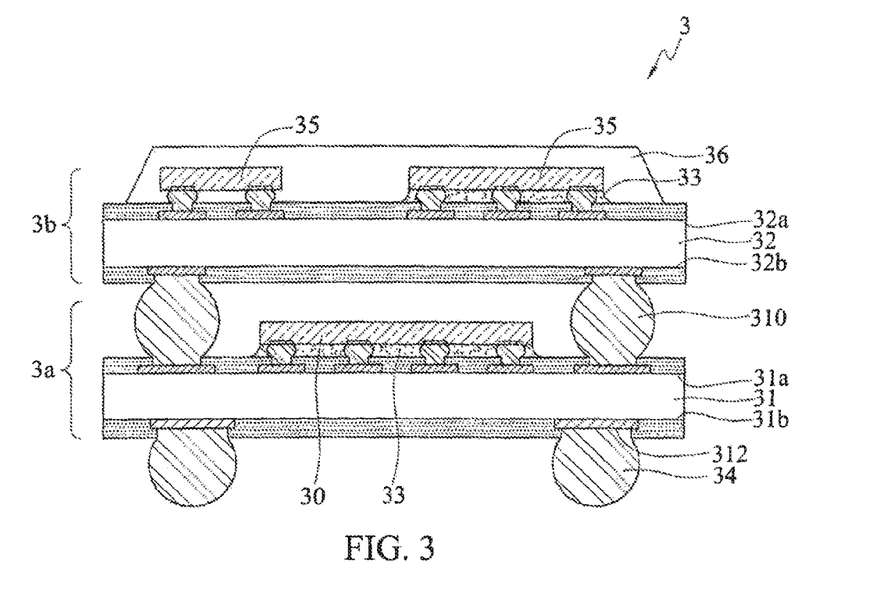
FIG. 3 is a schematic cross-sectional view of a conventional POP structure.

FIG. 3 is schematic cross-sectional view of a conventional POP structure.

Referring to FIG. 3, a second package 3b is stacked on a first package 3a to form a POP structure 3.

The first package 3a has a first chip carrier 31 having opposite first and second surfaces 31a, 31b, and a first electronic element 30 disposed on the first surface 31a of the first chip carrier 31 and electrically connected to the first chip carrier 31. The second package 3b has a second chip carrier 32 having opposite third and fourth surfaces 32a, 32b, at least a second electronic element 35 disposed on the third surface 32a of the second chip carrier 32 and electrically connected to the second chip carrier 32, and an encapsulant 36 formed on the second chip carrier 32 for encapsulating the second electronic element 35. Further, a plurality of solder balls 310 are formed on the first surface 31a of the first chip carrier 31 and the second chip carrier 32 is stacked on the solder balls 310 via the fourth surface 32b thereof so as to be electrically connected to the first chip carrier 31. A plurality of conductive pads 312 are formed on the second surface 31b of the first chip carrier 31 for mounting solder balls 34. The first and second electronic elements 30, 35 can be active and/or passive elements. The first electronic element 30 is electrically connected to the first chip carrier 31 in a flip-chip manner, and the second electronic elements 35 is electrically connected to the second chip carrier 32 in a flip-chip manner. An underfill 33 is further filled between the first electronic element 30 and the first chip carrier 31 and between the second electronic element 35 and the second chip carrier 32 to form flip-chip bondings.

However, the POP structure 3 has a big size and cannot meet the miniaturization requirement. For example, the solder balls 310 are required to have a certain pitch therebetween so as to prevent bridging from occurring, thus making it difficult to reduce the size of the first chip carrier 31.

On the other hand, 3D IC chip stacking technologies have been developed. For example, a silicon interposer having a plurality of through silicon vias (TSVs) is disposed between a packaging chip carrier and at least a semiconductor chip. Since the silicon interposer can have a wire diameter/pitch of 3/3 um or less, the semiconductor chips having high I/O counts can be disposed on the silicon interposer without the need to increase the area of the packaging chip carrier, thereby meeting the miniaturization requirement.

However, to form the TSVs of the silicon interposer, a plurality of through holes need to be formed in the silicon interposer through a patterning process such as exposure, development and etching and then filled with metal, which incurs a high cost. For example, for a 12-inch wafer, the TSV cost is about 40 to 50% of the total cost for fabricating the silicon interposer (not including labor cost). Further, the fabrication process of the TSVs is time-consuming, especially when the silicon interposer is etched to form the through holes. Consequently, the final product increase in cost.

Therefore, there is a need to provide a package structure and a method for fabricating the same so as to overcome the above-described drawbacks.

SUMMARY OF THE INVENTION

In view of the above-described drawbacks, the present invention provides a package structure, which comprises: a chip carrier having a plurality of conductive connection portions; at least an electronic element disposed on the chip carrier; a plurality of conductive wires erectly positioned on the conductive connection portions, respectively, wherein each of the conductive wires has opposite first and second ends and the conductive wires are bonded to the conductive connection portions via the first ends thereof; an encapsulant formed on the chip carrier for encapsulating the conductive wires and the electronic element, wherein the encapsulant has opposite first and second surfaces, the encapsulant is bonded to the chip carrier and the conductive connection portions via the first surface thereof, and the second ends of at least a certain number of the conductive wires are exposed from the second surface of the encapsulant; and a circuit layer formed on the second surface of the encapsulant and electrically connected to the exposed second ends of the conductive wires.

The present invention further provides a method for fabricating a package structure, which comprises the steps of: providing a chip carrier having a plurality of conductive connection portions and disposing at least an electronic element on the chip carrier; erectly positioning a plurality of conductive wires on the conductive connection portions, respectively, wherein each of the conductive wires has opposite first and second ends and the conductive wires are bonded to the conductive connection portions via the first ends thereof; forming an encapsulant on the chip carrier for encapsulating the conductive wires and the electronic element, wherein the encapsulant has opposite first and second surfaces, the encapsulant is bonded to the chip carrier and the conductive connection portions via the first surface thereof, and the second ends of at least a certain number of the conductive wires are exposed from the second surface of the encapsulant; and forming a circuit layer on the second surface of the encapsulant, wherein the circuit layer is electrically connected to the exposed second ends of the conductive wires.

In the above-described method, the conductive wires can be formed by wire bonding.

In the above-described structure and method, a circuit structure having opposite first and second sides can be formed in the chip carrier in a manner that the conductive connection portions are formed on the first side of the circuit structure. Further, a plurality of conductive elements can be formed on the second side of the circuit structure and electrically connected to the circuit structure. Furthermore, a carrier can be disposed on the second side of the circuit structure and electrically connected to the circuit structure. The carrier can be made of a semiconductor material, a dielectric material, ceramic or metal. A plurality of conductive through holes can be formed in the carrier and electrically connected to the circuit structure. Alternatively, after the circuit layer is formed, the carrier can be removed.

In the above-described structure and method, the electronic element can be electrically connected to the chip carrier.

In the above-described structure and method, the electronic element can be exposed from the second surface of the encapsulant.

In the above-described structure and method, the conductive wires can have a wire diameter ranged from 0.01 to 0.15 mm.

In the above-described structure and method, a pitch between any adjacent two of the conductive wires can be in the 0.03 to 0.3 mm range.

In the above-described structure and method, at least an electronic device can be stacked on the second surface of the encapsulant and electrically connected to the circuit layer. The electronic device can be stacked on and electrically connected to the circuit layer through a plurality of conductive elements.

In the above-described structure and method, the encapsulant can further have a side surface adjacent to the first and second surfaces and the second ends of a certain number of the conductive wires can be exposed from the side surface of the encapsulant.

According to the present invention, the conductive wires serve as an electrical interconnection structure. Since the wire diameter of the conductive wires can be less than 0.15 mm, the pitch between the conductive wires can be less than 0.3 mm. Therefore, the package structure of the present invention is not limited by the specification of solder balls as in the prior art, and the pitch between the conductive connection portions or the circuit layers can be reduced to increase the joint density, thus reducing the size of the package structure and increasing the I/O density of the electronic element.

Further, by using a wiring bonding method to form the conductive wires, the present invention dispenses with the conventional silicon interposer process and greatly reduces the cost.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modifications and variations can be made without departing from the spirit of the present invention. Further, terms such as "first", "second", "on", "a" etc. are merely for illustrative purposes and should not be construed to limit the scope of the present invention.

FIGS. 1A through 1G are schematic cross-sectional views showing a method for fabricating a package structure according to a first embodiment of the present invention.

Figure 1A:
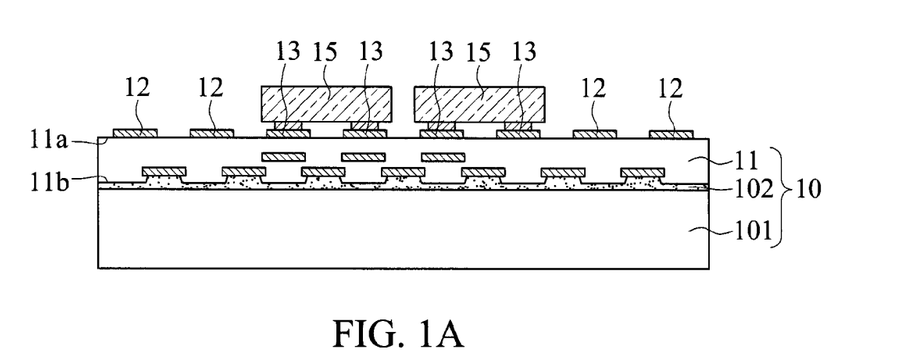
FIGS. 1A through 1G are schematic cross-sectional views showing a method for fabricating a package structure according to a first embodiment of the present invention, wherein FIG. 1D' shows another embodiment of FIG. 1D, and FIGS. 1F' and 1F" show other embodiments of FIG. 1F.

Referring to FIG. 1A, a chip carrier 10 having a plurality of conductive connection portions 12 and a plurality of conductive pads 13 is provided. A plurality of electronic elements 15 are flip-chip disposed on the conductive pads 13 of the chip carrier 10 so as to be electrically connected to the chip carrier 10.

In the present embodiment, the conductive connection portions 12 have a pad shape. The chip carrier 10 further has a carrier 101, a release layer 102 formed on the carrier 101 and a circuit structure 11 formed on the release layer 102. In particular, the carrier 101 is made of, but not limited to, a semiconductor material, a dielectric material, ceramic, glass or metal. The release layer 102 is formed on the carrier 101 by coating or laminating. The release layer 102 has an adhesive property. The circuit structure 11 has one or more redistribution layers.

Further, the circuit structure 11 has opposite first and second sides 11a, 11b. The conductive connection portions 12 and the conductive pads 13 are formed on the first side 11a of the circuit structure 11 and electrically connected to the circuit structure 11. An UBM (Under Bump Metallurgy) layer (not shown) is formed on the conductive pads 13 and the electronic elements 15 are flip-chip bonded to the UBM layer of the conductive pads 13.

Further, the carrier 101 is disposed on the second side 11b of the circuit structure 11 through the release layer 102.

The electronic elements 15 are arranged close to one another. The electronic elements 15 can be active elements, such as semiconductor chips, or passive elements, such as capacitors. In another embodiment, the electronic elements 15 are attached to the chip carrier 10 through a die attach film (DAF) or a conductive adhesive. Alternatively, the electronic elements 15 are electrically connected to the chip carrier 10 through wire bonding.

Figure 1B:
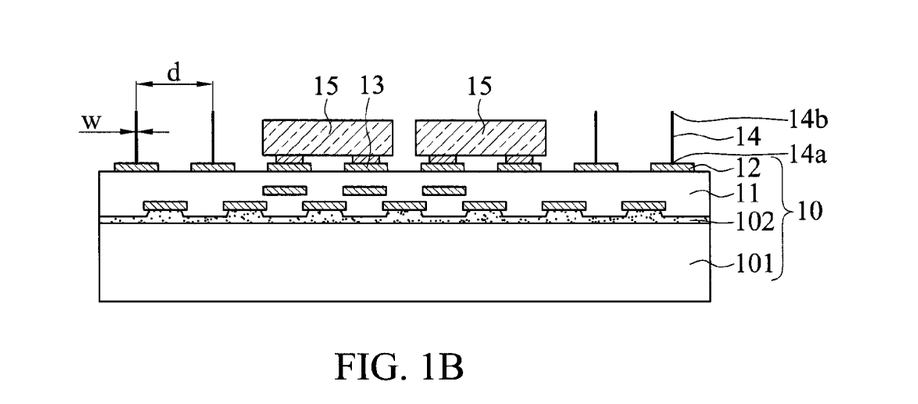

Referring to FIG. 1B, a plurality of conductive wires 14 are erectly positioned on the conductive connection portions 12, respectively. Each of the conductive wires 14 has opposite first and second ends 14a, 14b, and the conductive wires 14 are bonded to the conductive connection portions 12 via the first ends 14a thereof.

In the present embodiment, each of the conductive connection portions 12 has only one conductive wire 14 formed thereon. Further, the conductive wires 14 are formed by wire bonding and have a vertical line shape. The conductive wires 14 serve as an electrical interconnection structure.

In addition, the conductive wires 14 have a wire diameter w that is less than 0.15 mm, and a pitch d between any adjacent two of the conductive wires 14 is less than 0.3 mm.

Figure 1C:
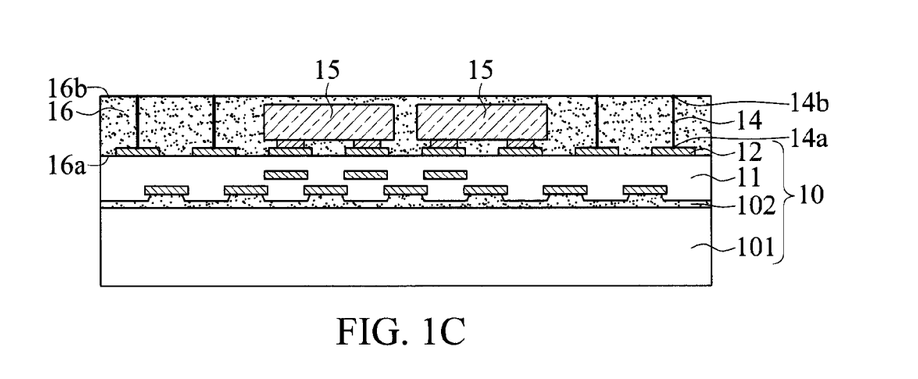

Referring to FIG. 1C, an encapsulant 16 is formed on the chip carrier 10 for encapsulating the conductive wires 14 and the electronic elements 15. The encapsulant 16 has opposite first and second surfaces 16a, 16b. The encapsulant 16 is bonded to the chip carrier 10 and the conductive connection portions 12 via the first surface 16a thereof, and the second ends 14b of the conductive wires 14 are exposed from the second surface 16b of the encapsulant 16.

In the present embodiment, the encapsulant 16 is formed through liquid encapsulation, injection or compression molding. Further, a release film is formed inside a mold. As such, after the mold is removed, the second ends 14b of the conductive wires 14 are exposed from the second surface 16b of the encapsulant 16. In addition, upper surfaces of the electronic elements 15 are covered by the encapsulant 16.

Figure 1D:
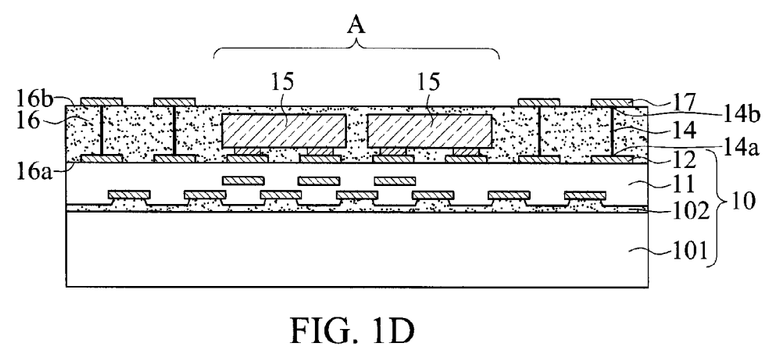

Referring to FIG. 1D, a circuit layer 17 is formed on the second surface 16b of the encapsulant 16. Some circuit portions or pad portions of the circuit layer 17 are electrically connected to the second ends 14b of the conductive wires 14. As such, the circuit layer 17 is electrically connected to the conductive connection portions 12 through the conductive wires 14.

In the present embodiment, the circuit layer 17 is a redistribution layer. In other embodiments, a plurality of redistribution layers are formed on the second surface 16b of the encapsulant 16 according to the practical need.

Further, an OSP (Organic Solderability Preservative) layer (not shown) can be formed on the circuit layer 17 by coating so as to prevent oxidation of a metal surface of the circuit layer 17 that otherwise may adversely affect signal transmission.

Furthermore, a non-wiring area A can be defined on the second surface 16b of the encapsulant 16 over the electronic elements 15. That is, no circuits are formed on the non-wring area A. Further, referring to FIG. 1D', a plurality of openings 160 are formed in the non-wiring area A according to the practical need. Hence, the upper surfaces of the electronic elements 15 are exposed from the second surface 16b of the encapsulant 16 for heat dissipation or mounting an external element.

Figure 1E:
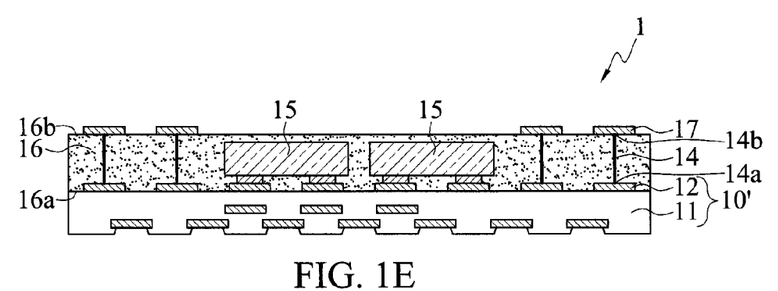

Referring to FIG. 1E, the release layer 102 and the carrier 101 are removed to form a chip carrier 10'.

Figure 1F:
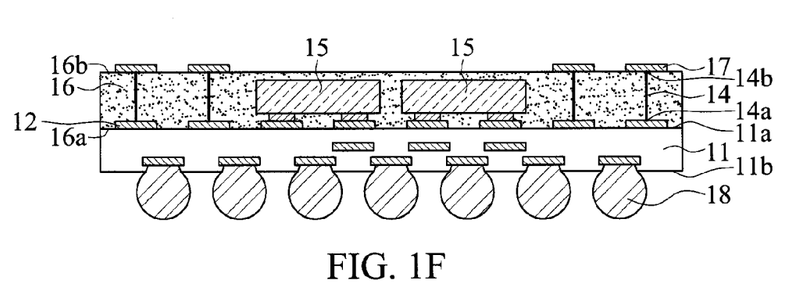

Referring to FIG. 1F, a singulation process is performed and a plurality of conductive elements 18, such as solder balls, are formed on the second side 11b of the circuit structure 11 and electrically connected to the circuit structure 11. Further, an electronic device such as a circuit board (not shown) can be disposed on the conductive elements 18.

According to the present invention, the conductive wires 14 serve as an electrical interconnection structure. Since the wire diameter of the conductive wires is less than 0.15 mm, the pitch d between the conductive wires 14 can be less than 0.3 mm. Therefore, compared with the conventional package structure that is limited by the specification of solder balls as in the prior art, the package structure 1 of the present invention meets the miniaturization requirement.

Further, by replacing the conventional solder balls with the conductive wires 14, the present invention increases the joint density (such as the conductive connection portions 12 and the circuit layer 17), thus reducing the size of the package structure 1 and increasing the I/O density.

Furthermore, by using a wiring bonding method to form the conductive wires 14, the present invention dispenses with the conventional silicon interposer process and greatly reduces the cost.

In another embodiment, referring to FIG. 1F', the upper surfaces of the electronic elements 15' are flush with and exposed from the second surface 16b of the encapsulant 16. In still another embodiment, referring to FIG. 1F'', the electronic elements 15'' are vertically stacked on one another, and the upper surface of a topmost electronic element 15'' is selectively exposed from the second surface 16b of the encapsulant 16.

Figure 1G:
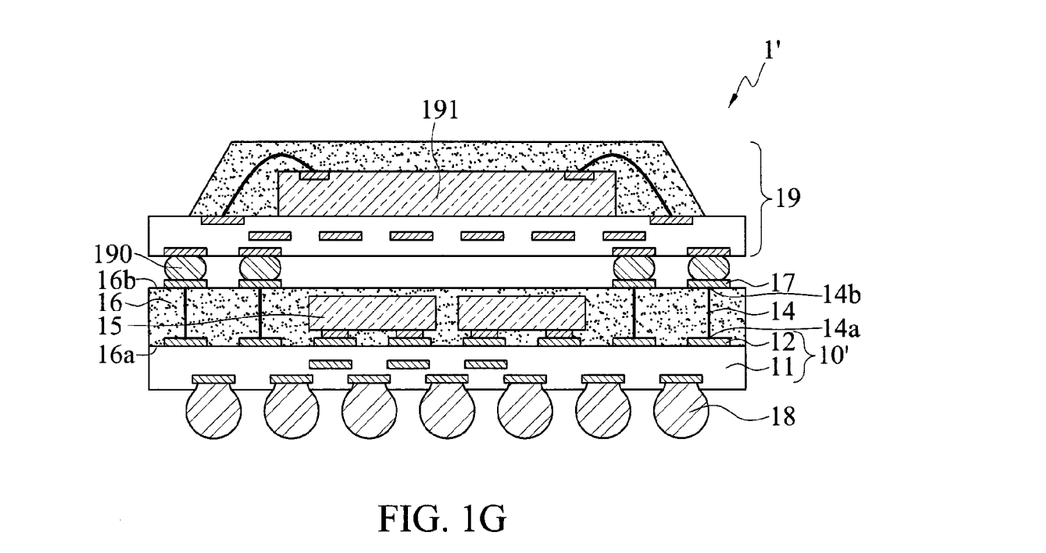

Referring to FIG. 1G, continued from FIG. 1F, an electronic device 19 is stacked on the second surface 16b of the encapsulant 16 and electrically connected to the circuit layer 17, thus forming a stack-type package structure 1'.

In the present embodiment, the electronic device 19 is, but not limited to, a package, a chip or a substrate.

The electronic device 19 is electrically connected to the circuit layer 17 through a plurality of conductive elements 190, for example, solder bumps or copper bumps. In another embodiment, the conductive elements are further formed in an area over the electronic elements 15.

Further, since the package structure 1 has a reduced size, the stack-type package structure 1' meets the miniaturization requirement.

In the present embodiment, the electronic device 19 has a wire-bonding type chip 191. In other embodiments, flip chips are provided in the electronic device 19.

Figure 2A:
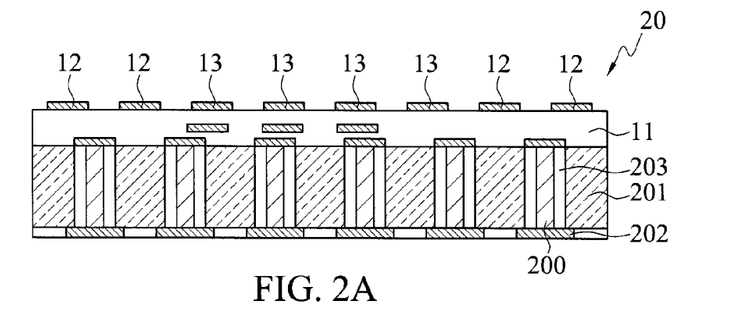
FIGS. 2A through 2C are schematic cross-sectional views showing a method for fabricating a package structure according to a second embodiment of the present invention.
Figure 2B:
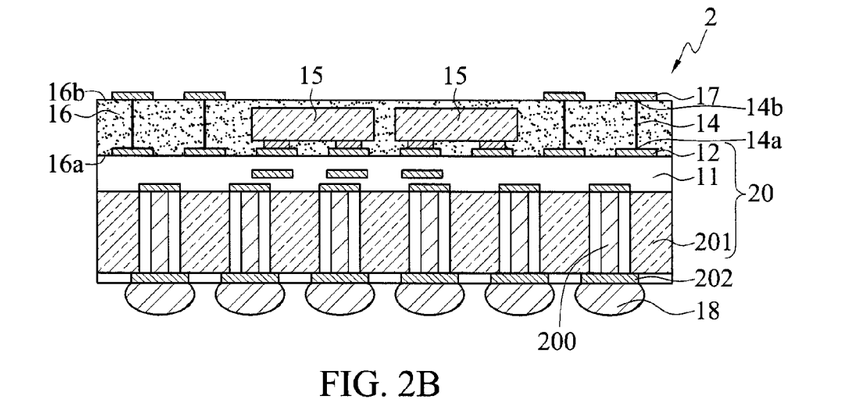
Figure 2C:
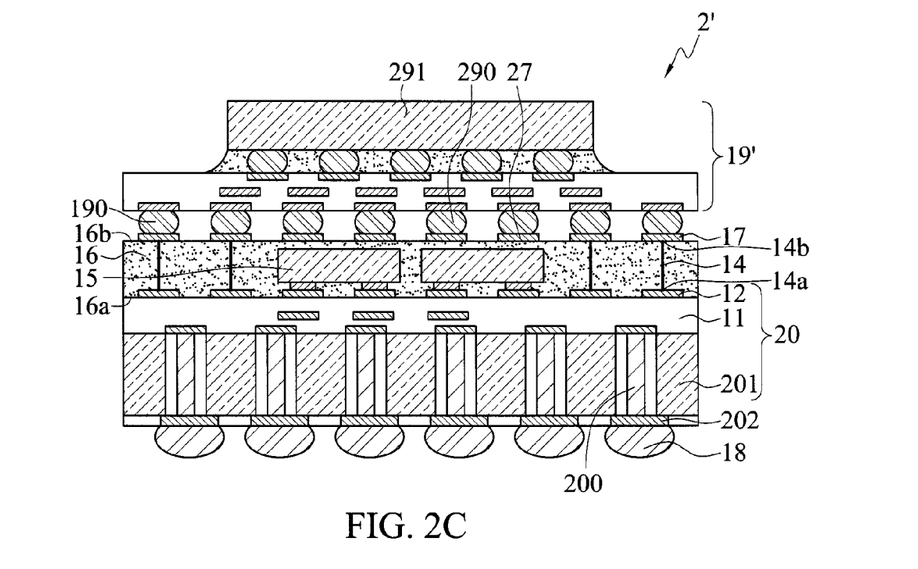

FIGS. 2A through 2C are schematic cross-sectional views showing a method for fabricating a package structure according to a second embodiment of the present invention. The second embodiment differs from the first embodiment in the configuration of the carrier.

Referring to FIG. 2A, a chip carrier 20 having a carrier 201 and a circuit structure 11 is provided.

In the present embodiment, the carrier 201 is made of a semiconductor material, a dielectric material, ceramic or metal, and a plurality of conductive through holes 200 are formed in the carrier 201. For example, the carrier 201 is a silicon interposer having a plurality of through silicon vias (TSVs). The circuit structure 11 is electrically connected to the conductive through holes 200. An insulating material 203 is selectively formed around a sidewall of each of the conductive through holes 200.

Further, a plurality of conductive pads 202 are formed on a lower side of the carrier 201 and electrically connected to the conductive through holes 200.

Referring to FIG. 2B, the processes of FIGS. 1B through 1D are performed and a plurality of conductive elements 18 are formed on the conductive pads 202 of the carrier 201 so as to be electrically connected to the conductive through holes 200, thereby forming a package structure 2.

Referring to FIG. 2C, the process of FIG. 1G is performed to form a stack-type package structure 2'.

In the present embodiment, the electronic device 19' has a flip chip 291. The conductive elements 290 are further formed in an area over the electronic elements 15 for strengthening the support for the electronic device 19'. In particular, at least an external connection pad 27 is formed on the second surface 16b of the encapsulant 16 for mounting the conductive element 290. The external connection pad 27 is electrically connected to the circuit layer 17 or not.

Figure 2D:
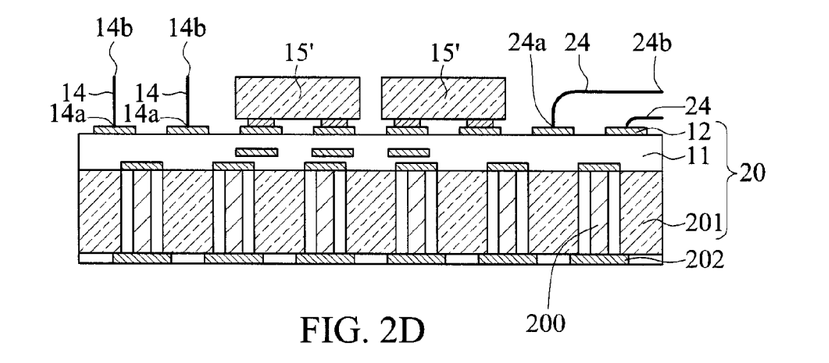
FIGS. 2D through 2F are schematic cross-sectional views showing a method for fabricating a package structure according to a third embodiment of the present invention, wherein FIG. 2F' shows another embodiment of FIG. 2F.
Figure 2E:
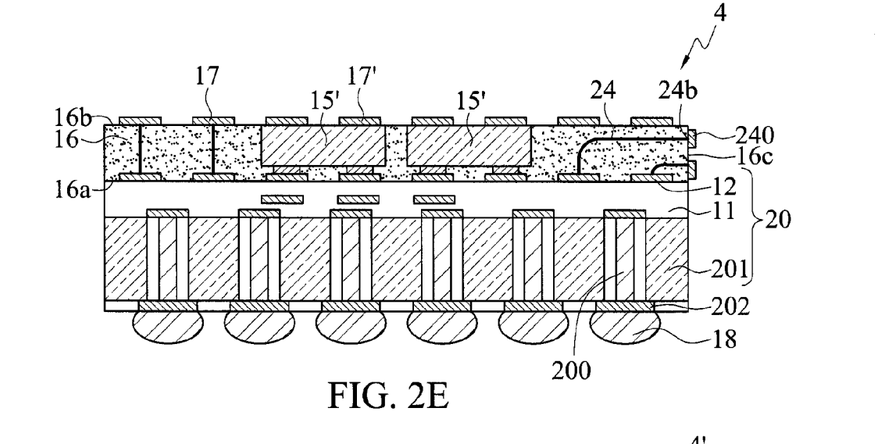
Figure 2F:
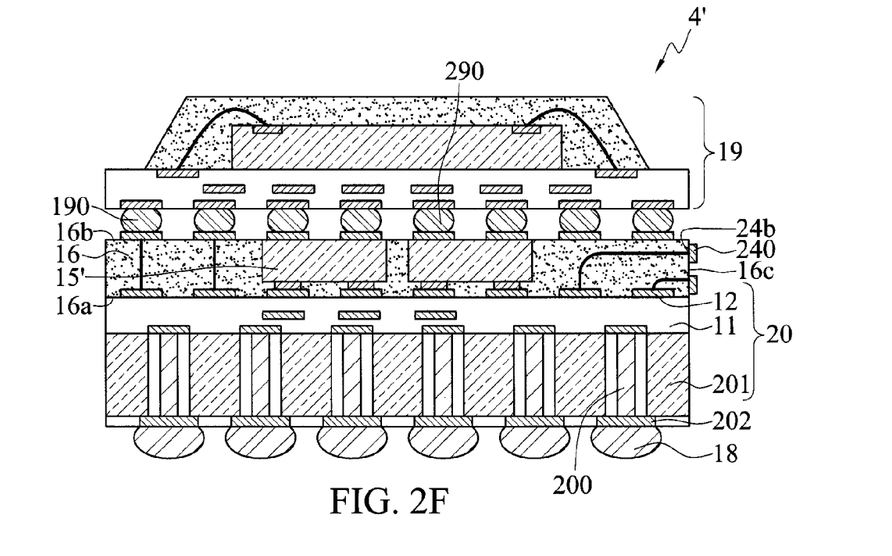

FIGS. 2D through 2F are schematic cross-sectional views showing a method for fabricating a package structure according to a third embodiment of the present invention. The present embodiment differs from the above-described embodiments in the configuration of the conductive wires.

Referring to FIG. 2D, a plurality of conductive wires 14, 24 are formed on the conductive connection portions 12, respectively. Each of the conductive wires 14 has opposite first and second ends 14a 14b, and each of the conductive wires 24 has opposite first and second ends 24a, 24b. The conductive wires 14, 24 are electrically connected to the conductive connection portions 12 through the first ends 14a thereof.

In the present embodiment, the conductive wires 14 have a vertical line shape and the conductive wires 24 have a curved shape.

Referring to FIG. 2E, the processes of FIGS. 1C through 1F are performed to form a package structure 4. The encapsulant 16 further has a side surface 16c adjacent to the first and second surfaces 16a, 16b. The second ends 24b of the conductive wires 24 are exposed from the side surface 16c to serve as electrical contacts for being electrically connected to an electronic device.

In the present embodiment, at least a redistribution layer 240 is formed on the side surface 16c of the encapsulant 16 and the second ends 24b of the conductive wires 24. Alternatively, an UBM layer or an ACF (Anisotropic Conductive Film) (not shown) can be formed on the second ends 24b of the conductive wires 24 to serve as conductive pads.

Further, the upper surfaces of the electronic elements 15' can be flush with and exposed from the second surface 16b of the encapsulant 16.

The circuit layer 17' can be selectively formed on the upper surfaces of the electronic elements 15' and electrically connected to the electronic elements 15'.

Referring to FIG. 2F, the process of FIG. 1G is performed to form a stack-type package structure 4'. The second ends 24b of the conductive wires 24 facilitate a test of the electronic elements 15 from the side surface of the package structure 4'.

In the present embodiment, the conductive elements 290 are further formed to come into contact with the circuit layer 17' on the electronic elements 15' so as to facilitate heat dissipation of the electronic elements 15' or electrical connection between the electronic elements 15' and the electronic device 19. Alternatively, the conductive elements 290 can be in direct contact with the upper surfaces 15' of the electronic elements 15'.

In another embodiment, referring to FIG. 2F', after an RDL, UBM, ACF or OSP layer (not shown) is formed on the side surface 16c of the encapsulant 16, a plurality of conductive elements 28 made of such as a solder material is formed on and electrically connected to the second ends 24b of the conductive wires 24. Further, a plurality of package structures 4" are electrically connected through the conductive elements 28, thereby forming a package module 5 having both vertical and horizontal electrical connection paths. Thereafter, the package module 5 can be mounted on a circuit board (not shown) by using SMT (Surface Mount Technology) technologies.

In the present embodiment, each of the conductive elements 190 has a copper bump 190' covered by a solder material. Consequently, the usage of the solder material is reduced, thereby preventing bridging between the conductive elements 190 and hence increasing the product yield and meeting the fine pitch requirement.

The present invention further provides a package structure 1, 1', 2, 2', 4, 4', 4", which has: a chip carrier 10', 20 having a plurality of conductive connection portions 12; at least an electronic element 15, 15', 15" disposed on the chip carrier 10', 20; a plurality of conductive wires 14, 24 erectly positioned on the conductive connection portions 12, respectively, wherein each of the conductive wires 14, 24 has a first end 14a, 24a and a second end 14b, 24b opposite to the first end 14a, 24a and the conductive wires 14, 24 are bonded to the conductive connection portions 12 via the first ends 14a, 24a thereof; an encapsulant 16 formed on the chip carrier 10', 20 for encapsulating the conductive wires 14, 24 and the electronic element 15, 15', 15", wherein the encapsulant 16 has opposite first and second surfaces 16a, 16b, the encapsulant 16 is bonded to the chip carrier 10', 20 and the conductive connection portions 12 via the first surface 16a thereof, and the second ends 14b of at least a certain number of the conductive wires 14 are exposed from the second surface 16b of the encapsulant 16; and a circuit layer 17 formed on the second surface 16b of the encapsulant 16 and electrically connected to the exposed second ends 14b of the conductive wires 14.

Further, a circuit structure 11 having opposite first and second sides 11a, 11b can be formed in the chip carrier 10', 20 in a manner that the conductive connection portions 12 are formed on the first side 11a of the circuit structure 11.

The electronic element 15, 15', 15" can be electrically connected to the chip carrier 10', 20.

The conductive wires 14, 24 can have a wire diameter w of in the 0.01 to 0.15 mm range, and a pitch d between any adjacent two of the conductive wires 14, 24 can be in the 0.03 to 0.3 mm range.

In an embodiment, a plurality of conductive elements 18 are formed on the second side 11b of the circuit structure 11 and electrically connected to the circuit structure 11.

In an embodiment, the chip carrier 20 further has a carrier 201. The carrier 201 is disposed on the second side 11b of the circuit structure 11 and electrically connected to the circuit structure 11. For example, the carrier 201 is made of a semiconductor material, a dielectric material, ceramic or metal. A plurality of conductive through holes 200 are formed in the carrier 201 and electrically connected to the circuit structure 11.

In an embodiment, the electronic element 15' is exposed from the second surface 16b of the encapsulant 16.

In an embodiment, the package structure 1', 2' further has at least an electronic device 19, 19' stacked on the second surface 16b of the encapsulant 16 and electrically connected to the circuit layer 17. Therein, the electronic device 19, 19' is stacked on and electrically connected to the circuit layer 17 through a plurality of conductive elements 190, 190'.

In an embodiment, the encapsulant 16 further has a side surface 16c adjacent to the first and second surfaces 16a, 16b and the second ends 24b of a certain number of the conductive wires 24 are exposed from the side surface 16c of the encapsulant 16.

Therefore, the present invention uses the conductive wires as an electrical interconnection structure. Due to the small wire diameter of the conductive wires, the pitch between the conductive wires can be minimized so as to meet the miniaturization requirement and greatly reduce the cost.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A package structure, comprising:
   a chip carrier having a plurality of conductive connection portions;
   at least an electronic element disposed on the chip carrier;
   a plurality of conductive wires positioned on the conductive connection portions, respectively, wherein each of the conductive wires has opposite first and second ends and the conductive wires are bonded to the conductive connection portions via the first ends thereof, wherein a certain number of the conductive wires are formed in a vertical line shape by wire bonding and another certain number of the conductive wires are formed in a curved shape by wire bonding;
   an encapsulant formed on the chip carrier for encapsulating the conductive wires and the electronic element, wherein the encapsulant has opposite first and second surfaces and a side surface adjacent to the first and second surfaces, the encapsulant is bonded to the chip carrier and the conductive connection portions via the first surface thereof, the second ends of the conductive wires in the vertical line shape are exposed from the second surface of the encapsulant, and the second ends of the conductive wires in the curved shape are exposed from the side surface of the encapsulant;
   a redistribution layer (RDL), an under bump metallization (UBM) layer, an anisotropic conductive film (ACF) layer, or an organic solderability preservative (OSP) layer formed on the side surface of the encapsulant and in contact with the exposed second ends of the conductive wires in the curved shape; and
   a circuit layer formed on the second surface of the encapsulant and electrically connected to the exposed second ends of the conductive wires in the vertical shape.

2. The package structure of claim 1, wherein a circuit structure having opposite first and second sides is formed in the chip carrier in a manner that the conductive connection portions are formed on the first side of the circuit structure.

3. The package structure of claim 2, wherein a plurality of conductive elements are formed on the second side of the circuit structure and electrically connected to the circuit structure.

4. The package structure of claim 2, wherein a carrier is disposed on the second side of the circuit structure and electrically connected to the circuit structure.

5. The package structure of claim 4, wherein a plurality of conductive through holes are formed in the carrier and electrically connected to the circuit structure.

6. The package structure of claim 4, wherein the carrier is made of a semiconductor material, a dielectric material, ceramic or metal.

7. The package structure of claim 1, wherein the electronic element is electrically connected to the chip carrier.

8. The package structure of claim 1, wherein the electronic element is exposed from the second surface of the encapsulant.

9. The package structure of claim 1, wherein the conductive wires have a wire diameter ranged from 0.01 to 0.15 mm.

10. The package structure of claim 1, wherein a pitch between any adjacent two of the conductive wires is in the 0.03 to 0.3 mm range.

11. The package structure of claim 1, further comprising at least an electronic device stacked on the second surface of the encapsulant and electrically connected to the circuit layer.

12. The package structure of claim 11, wherein the electronic device is stacked on and electrically connected to the circuit layer through a plurality of conductive elements.

13. A method for fabricating a package structure, comprising the steps of:
    providing a chip carrier having a plurality of conductive connection portions and disposing at least an electronic element on the chip carrier;
    positioning a plurality of conductive wires on the conductive connection portions by wire bonding, respectively, wherein each of the conductive wires has opposite first and second ends and the conductive wires are bonded to the conductive connection portions via the first ends thereof, and wherein a certain number of the conductive wires are in a vertical line shape and another certain number of the conductive wires are in a curved shape;
    forming an encapsulant on the chip carrier for encapsulating the conductive wires and the electronic element, wherein the encapsulant has opposite first and second surfaces and a side surface adjacent to the first and second surfaces, the encapsulant is bonded to the chip carrier and the conductive connection portions via the first surface thereof, the second ends of the conductive wires in the vertical line shape are exposed from the second surface of the encapsulant, and the second ends of the conductive wires in the curved shape are exposed from the side surface of the encapsulant;
    forming a circuit layer on the second surface of the encapsulant, wherein the circuit layer is electrically connected to the exposed second ends of the conductive wires in the vertical line shape; and
    forming a redistribution layer (RDL), an under bump metallization (UBM) layer, an anisotropic conductive film (ACF) layer, or an organic solderability preservative (OSP) layer on the side surface of the encapsulant, wherein the RDL, the UBM layer, the ACF layer, or the OSP layer is in contact with the exposed second ends of the conductive wires in the curved shape.

14. The method of claim 13, wherein the chip carrier further has a circuit structure having opposite first and second sides and allowing the conductive connection portions to be formed on the first side thereof.

15. The method of claim 14, wherein a plurality of conductive elements are formed on the second side of the circuit structure and electrically connected to the circuit structure.

16. The method of claim 14, wherein the chip carrier further has a carrier disposed on the second side of the circuit structure and electrically connected to the circuit structure.

17. The method of claim 16, after forming the circuit layer, further comprising removing the carrier.

18. The method of claim 16, wherein the carrier has a plurality of conductive through holes formed therein and electrically connected to the circuit structure.

19. The method of claim 16, wherein the carrier is made of a semiconductor material, a dielectric material, ceramic or metal.

20. The method of claim 13, wherein the electronic element is electrically connected to the chip carrier.

21. The method of claim 13, wherein the electronic element is exposed from the second surface of the encapsulant.

22. The method of claim 13, wherein the conductive wires are formed by wire bonding.

23. The method of claim 13, wherein the conductive wires have aa wire diameter ranged from 0.01 to 0.15 mm.

24. The method of claim 13, wherein a pitch between any adjacent two of the conductive wires is in the 0.03 to 0.3 mm range.

25. The method of claim 13, further comprising stacking at least an electronic device on the second surface of the encapsulant, wherein the electronic device is electrically connected to the circuit layer.

26. The method of claim 25, wherein the electronic device is stacked on and electrically connected to the circuit layer through a plurality of conductive elements.

* * * * *